(12) United States Patent
Chung et al.

(10) Patent No.: US 8,173,499 B2
(45) Date of Patent: May 8, 2012

(54) METHOD OF FABRICATING A GATE STACK INTEGRATION OF COMPLEMENTARY MOS DEVICE

(75) Inventors: Shu-Wei Chung, Taichung (TW);
Kuo-Feng Yu, Hsin-Chu (TW);
Shyue-Shyh Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 135 days.

(21) Appl. No.: 12/750,413

(22) Filed: Mar. 30, 2010

(65) Prior Publication Data

US 2010/0317181 A1 Dec. 16, 2010

Related U.S. Application Data

(60) Provisional application No. 61/186,715, filed on Jun. 12, 2009.

(51) Int. Cl.
*H01L 21/8238* (2006.01)
*H01L 29/788* (2006.01)

(52) U.S. Cl. ............... 438/199; 438/585; 438/E21.409; 257/316

(58) Field of Classification Search .................. None
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,602,006 B2 * | 10/2009 | Huang et al. | 257/316 |
| 7,605,449 B2 | 10/2009 | Liu et al. | |
| 7,811,890 B2 * | 10/2010 | Hsu et al. | 438/270 |
| 7,993,999 B2 * | 8/2011 | Basker et al. | 438/199 |
| 2005/0153490 A1 | 7/2005 | Yoon et al. | |
| 2007/0054448 A1 * | 3/2007 | Choi et al. | 438/201 |
| 2007/0120156 A1 | 5/2007 | Liu et al. | |
| 2007/0122953 A1 | 5/2007 | Liu et al. | |

(Continued)

OTHER PUBLICATIONS

Cho, H.-J., et al., "The Impact of Stacked Cap Layers on Effective Work Function With HfSiON and SiON Gate Dielectrics," IEEE Electron Device Letters, vol. 29, No. 7, Jul. 2008, pp. 743-745.

*Primary Examiner* — Alonzo Chambliss
(74) *Attorney, Agent, or Firm* — Slater & Matsil, L.L.P.

(57) ABSTRACT

A method of forming an integrated circuit structure includes providing a substrate comprising a first device region and a second device region; forming an oxide cap over the substrate and in the first device region and the second device region; forming a first metal layer over the oxide cap, wherein the first metal layer has a first portion in the first device region and a second portion in the second device region; forming a mask to cover the second portion of the first metal layer, wherein the first portion of the first metal layer is exposed; removing the first portion of the first metal layer and the oxide cap from the first device region; removing the mask; and forming a second metal layer in the first device region and the second device region, wherein the second metal layer in the second device region is over the second portion of the first metal layer.

18 Claims, 10 Drawing Sheets

U.S. PATENT DOCUMENTS

| | | |
|---|---|---|
| 2007/0122954 A1 | 5/2007 | Liu et al. |
| 2007/0128782 A1 | 6/2007 | Liu et al. |
| 2007/0132053 A1 | 6/2007 | King et al. |
| 2008/0057644 A1* | 3/2008 | Kwak et al. .................. 438/257 |
| 2008/0087946 A1* | 4/2008 | Hsu et al. ..................... 257/328 |
| 2008/0266949 A1* | 10/2008 | He et al. .................. 365/185.05 |
| 2008/0290470 A1 | 11/2008 | King et al. |
| 2008/0296632 A1 | 12/2008 | Moroz et al. |
| 2009/0072276 A1* | 3/2009 | Inaba ............................ 257/255 |
| 2009/0181477 A1 | 7/2009 | King et al. |
| 2010/0129968 A1* | 5/2010 | Li et al. ........................ 438/154 |

* cited by examiner

METHOD OF FABRICATING A GATE STACK INTEGRATION OF COMPLEMENTARY MOS DEVICE

This application claims the benefit of U.S. Provisional Application No. 61/186,715 filed on Jun. 12, 2009, entitled "Gate Stack Integration of Complementary MOS Devices," which application is hereby incorporated herein by reference.

TECHNICAL FIELD

This invention relates generally to integrated circuit devices, and more particularly to complementary metal-oxide-semiconductor (CMOS) devices comprising gate dielectrics and metal gates.

BACKGROUND

Metal-oxide-semiconductor (MOS) devices are basic building elements in integrated circuits. A conventional MOS device typically has a gate electrode formed of polysilicon and doped with p-type or n-type impurities using doping operations such as ion implantation or thermal diffusion. It is preferred to adjust the work function of the gate electrode to the band-edge of the silicon. For an NMOS device, the work function of the gate electrode is preferably adjusted to close to the conduction band, and for a PMOS device, the work function of the gate electrode is preferably adjusted to close to the valence band. Adjusting the work function of the polysilicon gate electrode can be achieved by selecting appropriate impurities.

MOS devices with polysilicon gate electrodes exhibit a carrier depletion effect, which is also referred to as a poly depletion effect. The poly depletion effect occurs when applied electrical fields sweep away carriers from regions close to gate dielectrics, forming depletion layers. In an n-doped polysilicon layer, the depletion layer includes ionized non-mobile donor sites, whereas in a p-doped polysilicon layer, the depletion layer includes ionized non-mobile acceptor sites. The depletion effect results in an increase in the effective gate dielectric thickness, making it more difficult for an inversion layer to be created at the surface of the semiconductor substrate.

The poly depletion effect was previously solved by forming metal gate electrodes based on the art of replacement gate (RPG) or gate-first approaches. Fully silicided (FUSI) gate electrodes may also be used to eliminate the poly depletion effect. The metallic gates used in NMOS devices and PMOS devices by the above-mentioned approaches also preferably have band-edge work functions. Among these approaches, RPG and FUSI have shown a complexity in CMOS process flow and a high cost for manufacture. Contrary to RPG and FUSI, the gate-first approaches have the advantages of low cost and simple integrated flow. On the other hand, the effective gate dielectric thickness could be further reduced by high-k dielectrics, which normally have a k value larger than about 7.0. It seems that the gate-first approaches with the gate stack consisting of high-k dielectrics and metal gates result in the most attractive results. However, the gate-first approaches incur high threshold voltages due to the Fermi level pinning by oxygen vacancies of the high-k dielectric. To solve the Fermi level pinning problem, a capping oxide overlying the high-k dielectric was proposed to produce the dipole field to change work function. Compared to the capping oxide for NMOS devices, there are fewer kinds of capping oxide for PMOS devices and the options have smaller tuning ability. On the other hand, since metal gates are exposed to high temperatures in the annealing of source and drain regions, the work functions of these metallic materials shift, for example, toward the mid-gap level. The gate dielectric work function tuning ability by using metal gates is limited. The performance of the resulting PMOS devices is thus adversely affected.

Various approaches such as adding an oxide cap and performing counter doping have been taken to reduce the threshold voltages for PMOS devices (to reduce the absolute value of the negative threshold voltage). However, the reduction in the threshold voltages is very sensitive to the thickness of the oxide cap. Unfortunately, even if the thickness of the oxide cap can be controlled accurately as formed, the subsequent processes such as the removal of an overlying photo resist (also referred to as a mask, which is used for protecting the oxide cap in PMOS device regions during the removal of the oxide cap from NMOS device regions) may cause loss of or damage to the oxide cap. The threshold voltages and the reliability, e.g., time dependent dielectric breakdown (TDDB), are thus affected.

A further problem in conventional processes is that PMOS devices and NMOS devices often share a same metallic material as metal gates. To comply with the requirement of PMOS devices, the work function of the metallic materials of the metal gates have to meet the requirement of the PMOS devices. However, this results in the performance of the NMOS devices being compromised.

Accordingly, what is needed in the art is a semiconductor structure and respective formation methods that may incorporate metal gates and the gate dielectric thereof to take advantage of the benefits associated with optimized work functions while at the same time overcoming the deficiencies of the prior art.

SUMMARY OF THE INVENTION

In accordance with an aspect of an embodiment, a method of forming an integrated circuit structure includes providing a substrate comprising a first device region and a second device region; forming an oxide cap over the substrate and in the first device region and the second device region; forming a first metal layer over the oxide cap, wherein the first metal layer has a first portion in the first device region and a second portion in the second device region; forming a mask to cover the second portion of the first metal layer, wherein the first portion of the first metal layer is exposed; removing the first portion of the first metal layer and the oxide cap from the first device region; removing the mask; and forming a second metal layer in the first device region and the second device region, wherein the second metal layer in the second device region is over the second portion of the first metal layer.

Other embodiments are also included.

The advantageous features of the embodiments include reduced damage to oxide caps and more accurate control of the thickness of the oxide caps. The performance of NMOS devices and PMOS devices can thus be improved.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A method for forming complementary metal-oxide-semiconductor (CMOS) devices with metal gates and a gate dielectric is provided. The intermediate stages of manufacturing embodiments are illustrated. Throughout the various views and illustrative embodiments, like reference numbers are used to designate like elements.

Figure 1:
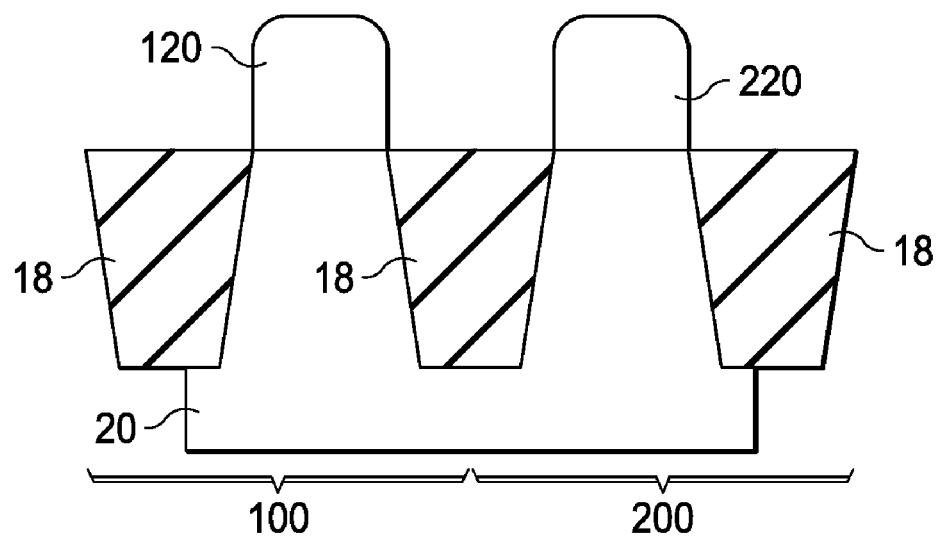
FIGS. 1 through 6, 7A, and 7B illustrate cross-sectional views and perspective views of a first embodiment, wherein fin field-effect transistors (FinFETs) are formed.

FIGS. 1 through 7B illustrate a first embodiment. Referring to FIG. 1, substrate 20 is provided, and may be formed of commonly used semiconductor materials such as silicon, silicon germanium (SiGe), gallium arsenic (GaAs), and the like. Shallow trench isolation (STI) regions 18 are formed in substrate 20, and may be used to define first device region 100 and second device region 200. In the following discussed embodiments, first device region 100 is referred to as NMOS device region 100, in which an NMOS device will be formed, and second device region 200 is referred to as PMOS device region 200, in which a PMOS device will be formed. Fins 120 and 220 are formed, for example, by removing the top portions of STI regions 18. Each of fins 120 and 220 comprises a top surface and opposite sidewalls. Fins 120 and 220, which are also the active regions of MOS devices, may be formed of the same or different materials from substrate 20.

Figure 2:
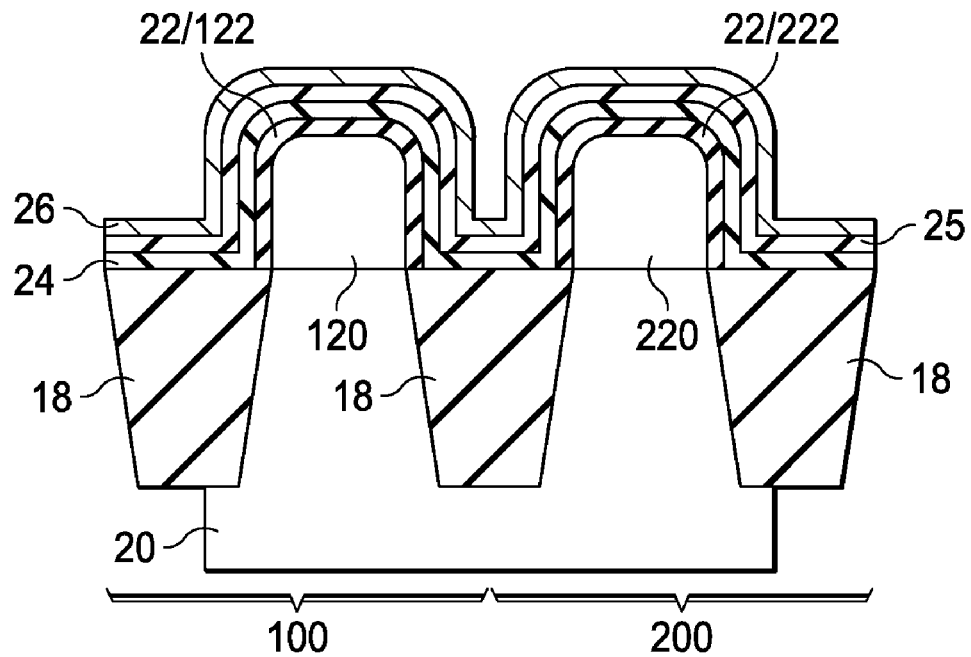

Referring to FIG. 2, interfacial layer 22 is formed on fins 120 and 220. Interfacial layer 22 helps buffer fins 120 and 220 and the overlying high-k dielectric layer, and may be formed using thermal oxidation or chemical oxidation (for example, dipping in ozone de-ionized (DI) water). Interfacial layer 22 includes portion 122 on fin 120 and portion 222 on fin 220.

First high-k dielectric layer 24 is formed on interfacial layer 22. First high-k dielectric layer 24 may have a k value greater than about 7.0, and may include a metal oxide, a nitrided metal oxide or a silicate of Hf, Al, La, Zr, Ti, Ta, Ba, Sr, Pb, Zn, Y, Gd, Dy, combinations thereof, and multi-layers thereof. The thickness of first high-k dielectric layer 24 may be between about 5 Å and about 100 Å. One skilled in the art will realize, however, that the dimensions recited throughout the specification are merely examples, and will change with the down-scaling of the formation technology.

Oxide cap 25 is formed on first high-k dielectric layer 24. The metal element contained in oxide cap 25 may have an electronegativity greater than the metal element contained in first high-k dielectric layer 24. Thus, the non-uniform electron claude causes a dipole field, which could modulate the gate electrode work function. In an embodiment, oxide cap 25 is formed of aluminum oxide ($Al_2O_3$), which is deposited on $HfO_2$. In other embodiments, oxide cap 25 comprises $TiO_2$. The thickness of oxide cap 25 may be between about 2 Å and about 40 Å, or even between about 40 Å and about 100 Å. The thickness of oxide cap 25 needs to be carefully controlled to accurately control the threshold voltage of the resulting PMOS device. The applicable formation methods of first high-k dielectric layer 24 and oxide cap 25 include molecular-beam deposition (MBD), atomic layer deposition (ALD), physical vapor deposition (PVD), chemical vapor deposition (CVD), and the like.

Next, first metal layer 26 is formed on first high-k dielectric layer 24, as also shown in FIG. 2. The exemplary materials for first metal layer 26 include Ti, Ta, W, Mo, Ru, Pt, Co, Ni, Pd, Nb, and alloys thereof. First metal layer 26 may alternatively comprise other less conductive metal compounds such as metal nitrides, e.g., TiN and TaN. First metal layer 26 may alternatively be formed of conductive oxide, e.g., RuO. In an exemplary embodiment, first metal layer 26 comprises TiN. The work function of first metal layer 26 may be higher than a mid-gap work function, and may be, for example, about 4.8 eV, or even higher than about 5.0 eV. Throughout the description, the term "mid-gap work function" refers to a work function at a middle level of the conduction band and valence band of silicon. An exemplary mid-gap work function may be about 4.65 eV. The work function of first metal layer 26 may be close to the valence band of silicon, which is about 5.2 eV. Throughout the description, metal materials with work functions greater than the mid-gap work function are referred to as p-type metal materials. First metal layer 26 may be formed by physical vapor deposition (PVD), atomic layer deposition (ALD), or other applicable chemical vapor deposition (CVD) methods. First metal layer 26 may have a thickness between about 0.5 nm and about 20 nm.

Figure 3:
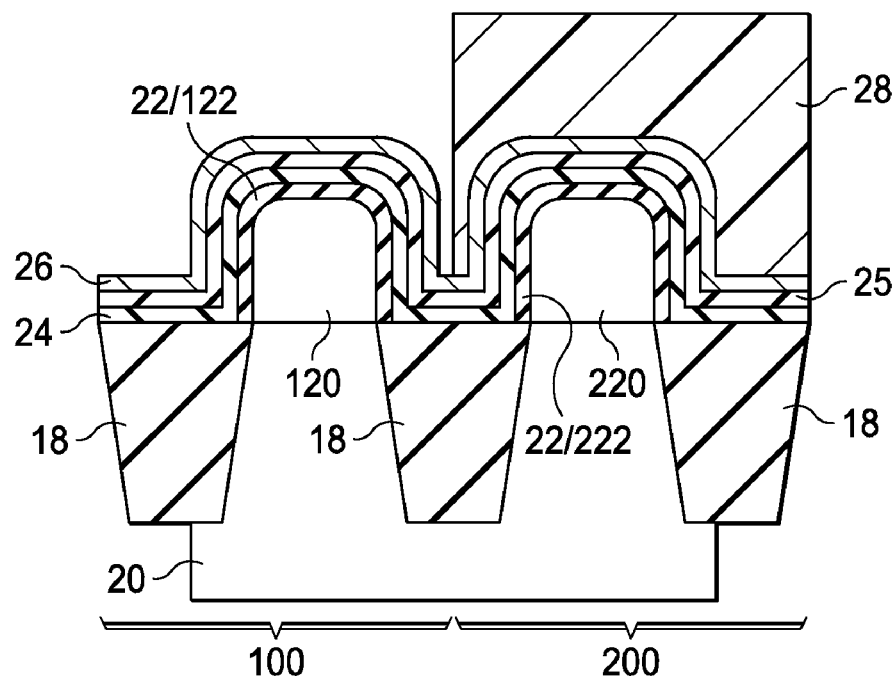
Figure 4:
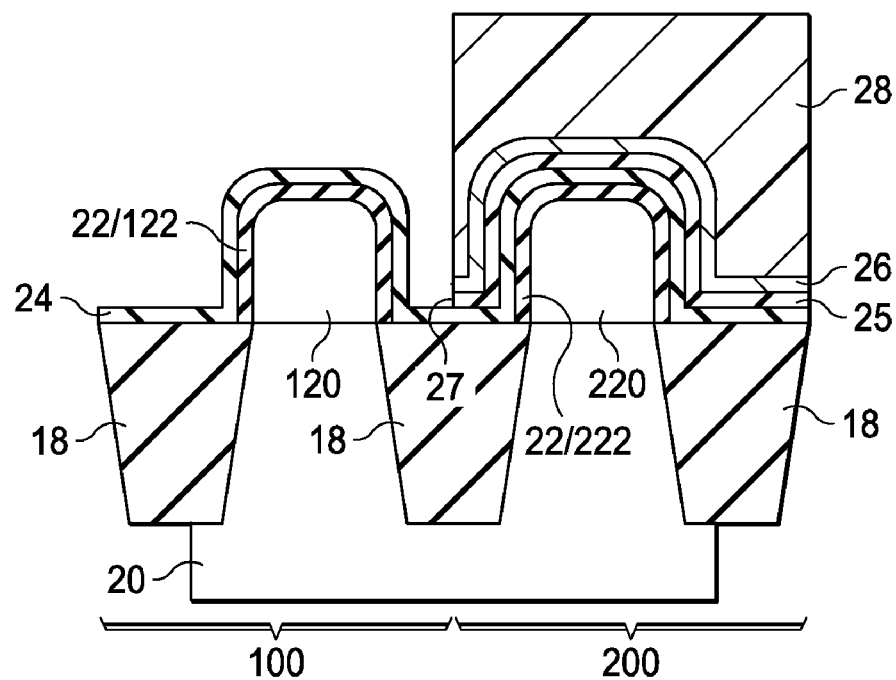

FIG. 3 illustrates the formation of photo resist 28, which is patterned to cover PMOS device region 200, leaving NMOS device region 100 exposed, while PMOS device region 200 is covered. Next, as shown in FIG. 4, the portions of first metal layer 26 and oxide cap 25 in NMOS device region 100 are removed, while the portions of first metal layer 26 and oxide cap 25 in NMOS device region 100 are protected by photo resist 28. The portion of first high-k dielectric layer 24 in NMOS device region 100 is thus exposed.

Figure 5:
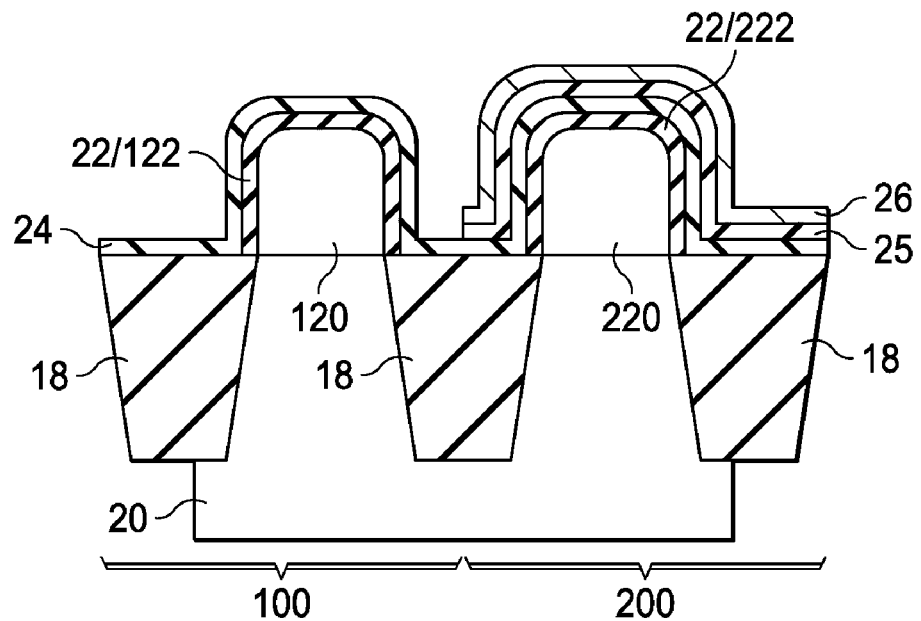

Referring to FIG. 5, photo resist 28 is removed, so that the underlying first metal layer 26 is exposed. It is observed that during the removal of photo resist 28, oxide cap 25 is protected by first metal layer 26, and hence no damage or loss may possibly occur. The thickness of oxide cap 25 will be the same as deposited. This makes accurate control of the thickness of oxide cap 25 possible. Since the threshold voltage of the PMOS device is sensitive to the thickness of oxide cap 25, accurate control of the thickness of oxide cap 25 in turn results in a more accurately controlled threshold voltage. As a comparison, if the removal of the portion of oxide cap 25 in NMOS device region 100 is performed before the formation of first metal layer 26, during the removal of photo resist 28, oxide cap 25 in PMOS device region 200 is likely to be damaged or lost, and the thickness may be reduced.

Figure 6:
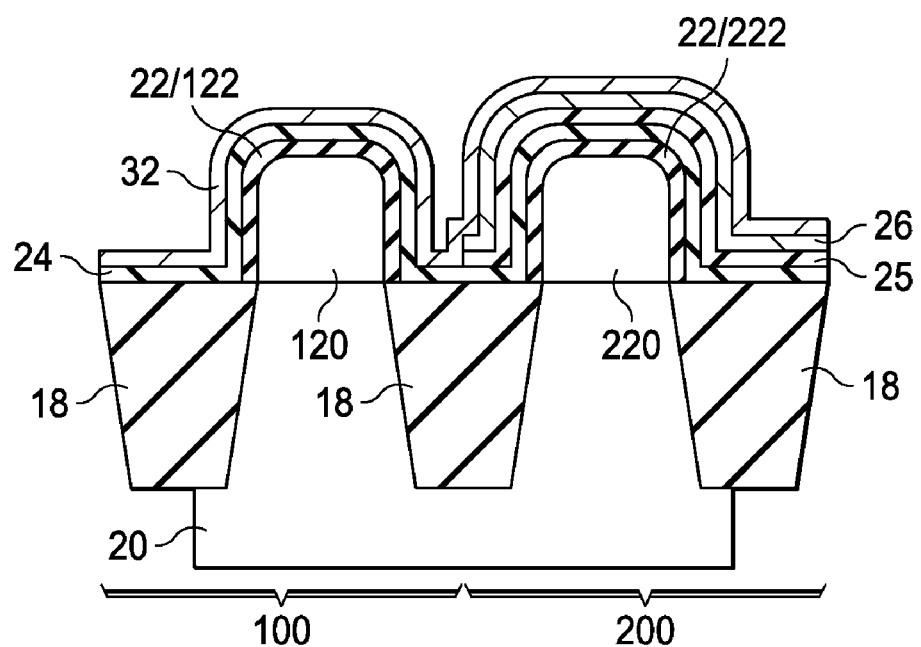

In FIG. 6, second metal layer 32 is formed. Again, second metal layer 32 may be formed of a material with a work function higher than the mid-gap work function. The work function of second metal layer 32 may be higher than about 4.8 eV, or even higher than about 5.0 eV. The work function of second metal layer 32 may also be close to the valence band of silicon, which is about 5.2 eV. Second metal layer 32 may also use a same material as that of first metal layer 26. Accordingly, the bottom portion of the metal gate in NMOS device region 100 and the top portion of the metal gate in PMOS device region 200 are formed of a same material, while the top portion of the metal gate in NMOS device region 100 and the bottom portion of the metal gate in PMOS device region 200 may be formed of the same material or different materials. Second metal layer 32 may have a thickness between about 0.5 nm and about 20 nm.

Figure 7A:
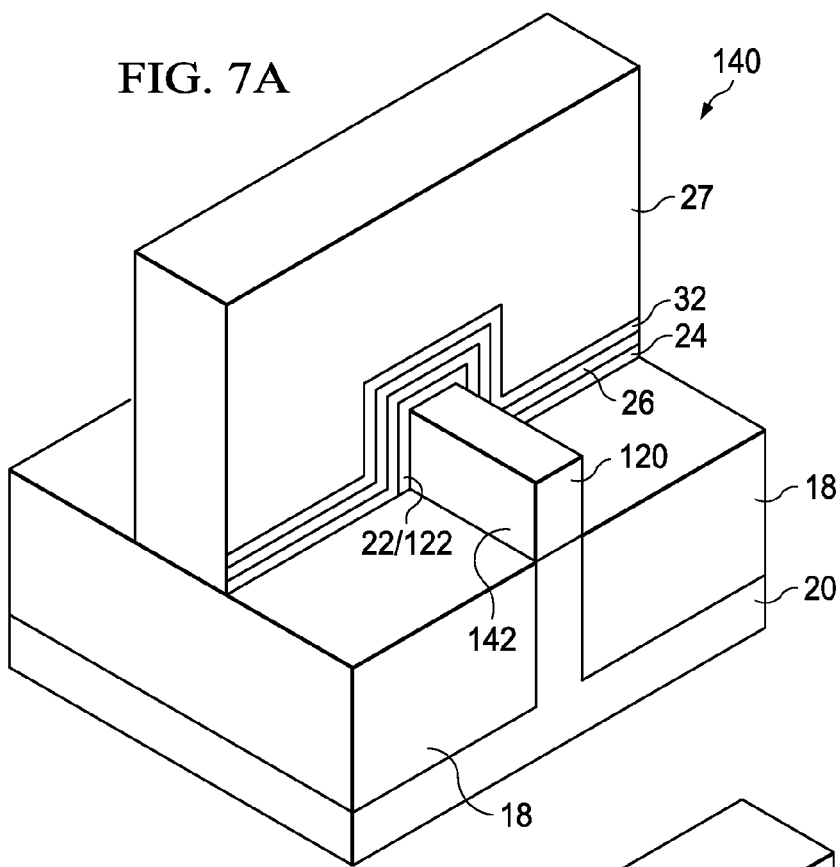
Figure 7B:
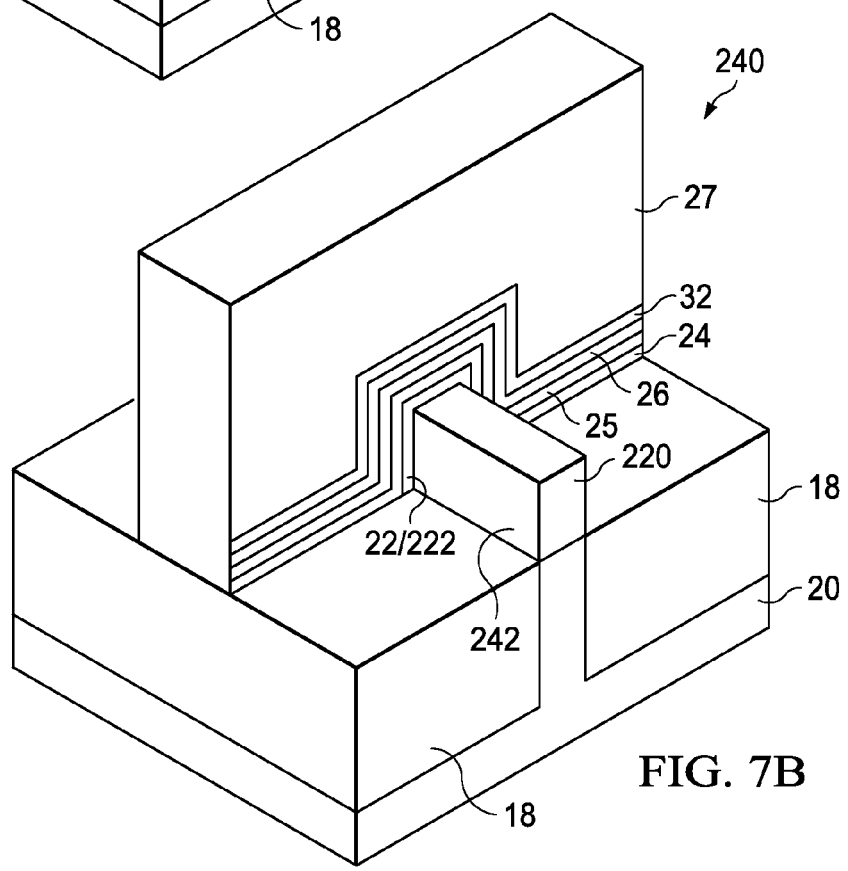

In subsequent steps, a polysilicon layer, an amorphous silicon layer, or combinations thereof, denoted as silicon-containing layer 27, is formed, followed by the patterning of layers 122, 222, 24, 25, 26 and 32 to form gate stacks. N-type fin field-effect transistor (FinFET) 140 is then formed in NMOS device region 100, as illustrated in FIG. 7A, and p-type FinFET 240 is formed in PMOS device region 200, as illustrated in FIG. 7B. FIGS. 7A and 7B are perspective views. As is known in the art, the formation of FinFETs also includes the formation of gate spacers (not shown), and source and drain regions 142 and 242. The formation processes are known in the art, and hence are not discussed in detail herein.

It is observed that the thickness of the metal gate (includes second metal layer 32) in n-type FinFET 140 is less than the thickness of the metal gate (includes first metal layer 26 and second metal layer 32) in p-type FinFET 240. The p-type FinFET 240 thus benefits from the increased thickness of the p-type metal layers, and the threshold voltage of p-type FinFET 240 may be further reduced. On the other hand, the thickness of the metal gate of n-type FinFET 140 is small, so that the adverse effect of the p-type metal gate is reduced. Accordingly, the metal gates and the respective formation processes of NMOS and PMOS devices are decoupled, resulting in improved performance for both NMOS and PMOS devices.

Figure 8:
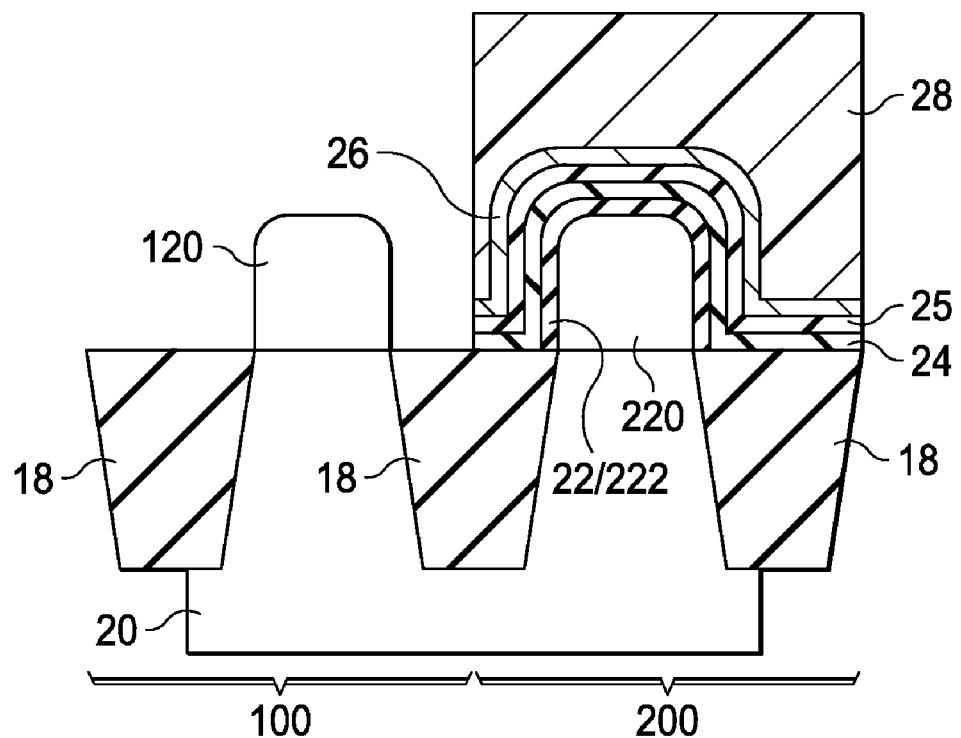
FIGS. 8 through 11 illustrate cross-sectional views of a second embodiment, wherein FinFETs are formed.
Figure 9:
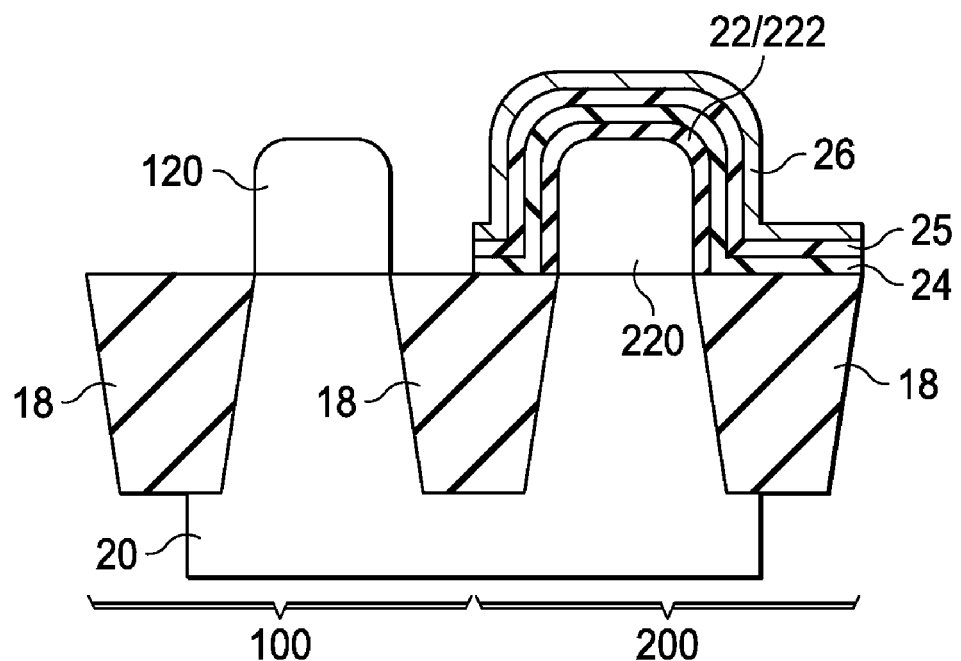

FIGS. 8-11 illustrate a second embodiment. The initial steps are essentially the same as shown in FIGS. 1 through 3. Next, as shown in FIG. 8, the portions of interfacial layer 22, first high-k dielectric layer 24, and first metal layer 26 in NMOS device region 100 are all removed, until fin 120 is exposed. FIG. 9 illustrates the removal of photo resist 28.

Figure 10:
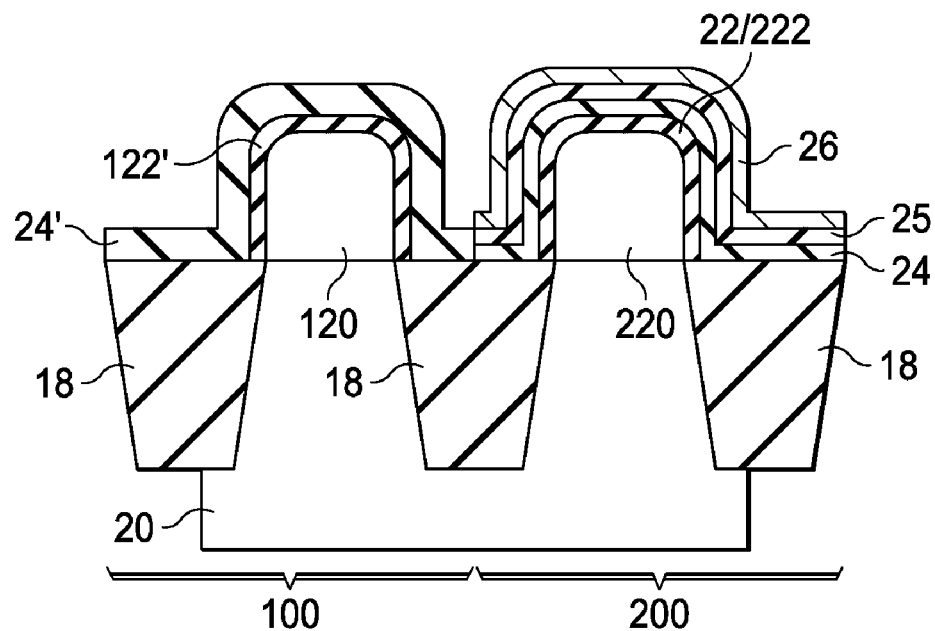

Referring to FIG. 10, interfacial layer 122' and second high-k dielectric layer 24' are selectively formed in NMOS device region 100, but not in PMOS device region 200. If any of second high-k dielectric layer 24' is undesirably formed on first metal layer 26 in PMOS device region 200, the bond may be weak and a soft clean may be performed to remove it. The re-grown interfacial layer 122' and second high-k dielectric layer 24' are free from the damage that may occur during the removal of first metal layer 26 from NMOS device region 100, resulting in a performance improvement. Interfacial layer 122' may be formed of a same material as, or a different material from, that of interfacial layer 22. Similarly, second high-k dielectric layer 24' may be formed of a same material as, or a different material from, that of first high-k dielectric layer 24. The available candidate materials of interfacial layer 122' and second high-k dielectric layer 24' may be found from the available materials of interfacial layer 22 and first high-k dielectric layer 24, respectively. In this embodiment, the thickness and material of second high-k dielectric layer 24' is decoupled from (and hence may be the same as or different from) that of first high-k dielectric layer 24.

Figure 11:
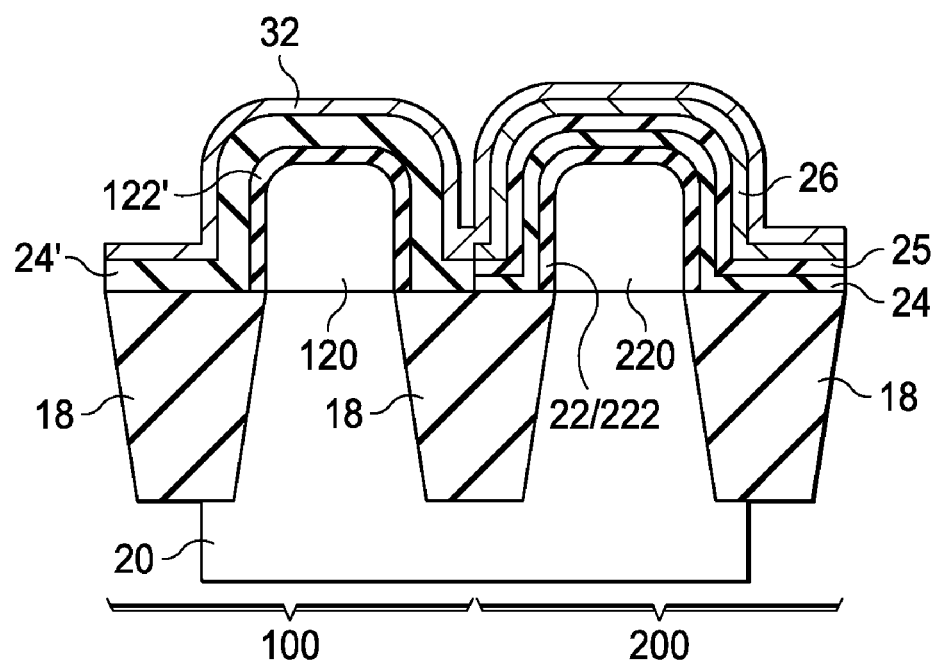

FIG. 11 illustrates the formation of second metal layer 32, which is essentially the same as discussed in the first embodiment. In subsequent steps, the polysilicon layer, the amorphous silicon layer, or the combinations thereof, denoted as silicon-containing layer 27, is formed, followed by the patterning of gate stacks and the formation of source and drain regions 142 and 242, as shown in FIGS. 7A and 7B.

Figure 12:
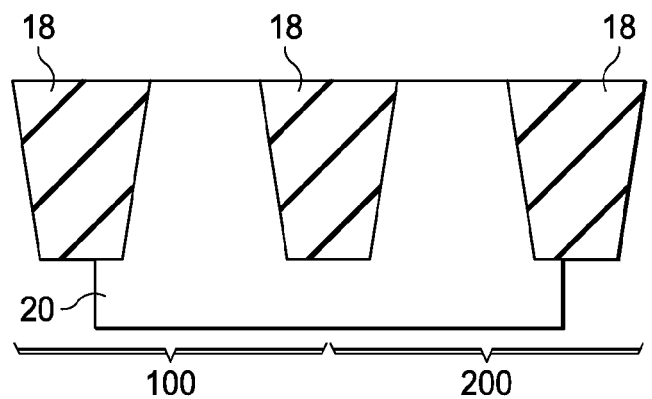
FIGS. 12 through 18 illustrate cross-sectional views of a third embodiment, wherein planar MOS devices are formed.
Figure 13:
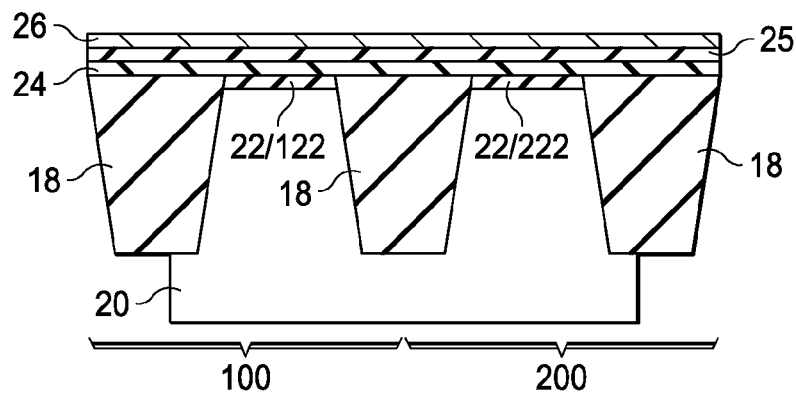
Figure 14:
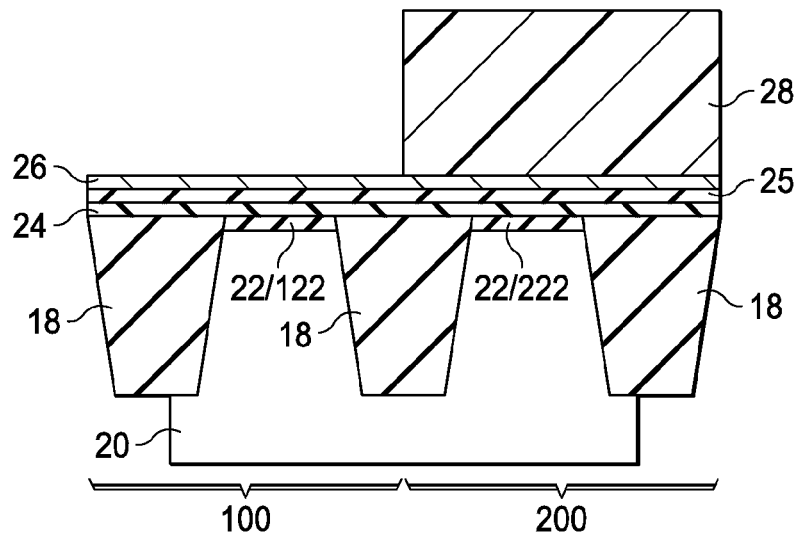
Figure 15:
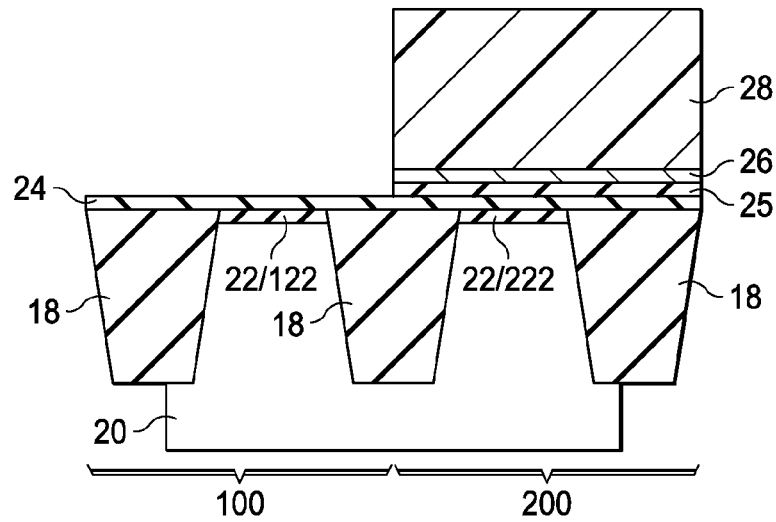
Figure 16:
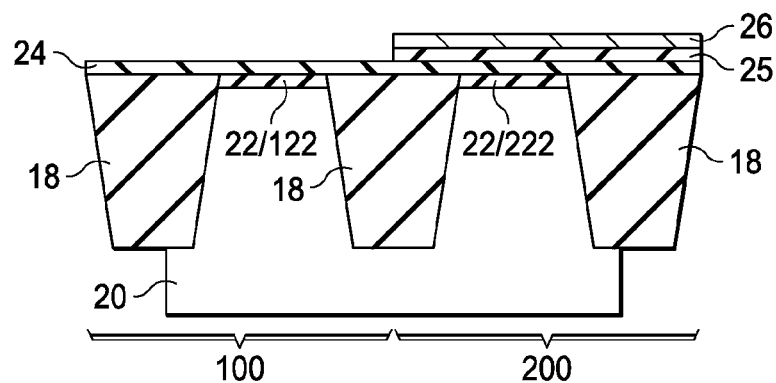
Figure 17:
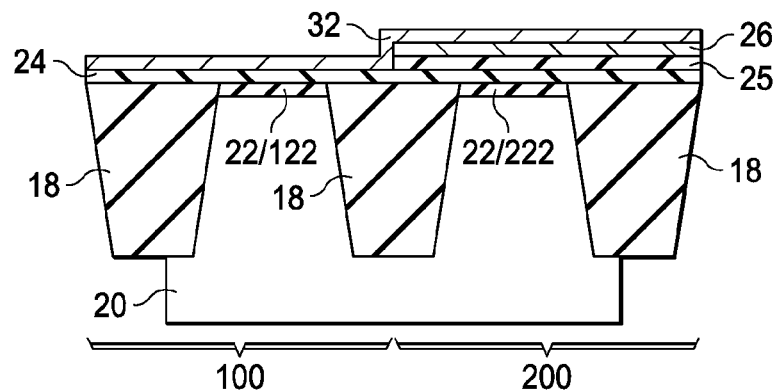
Figure 18:
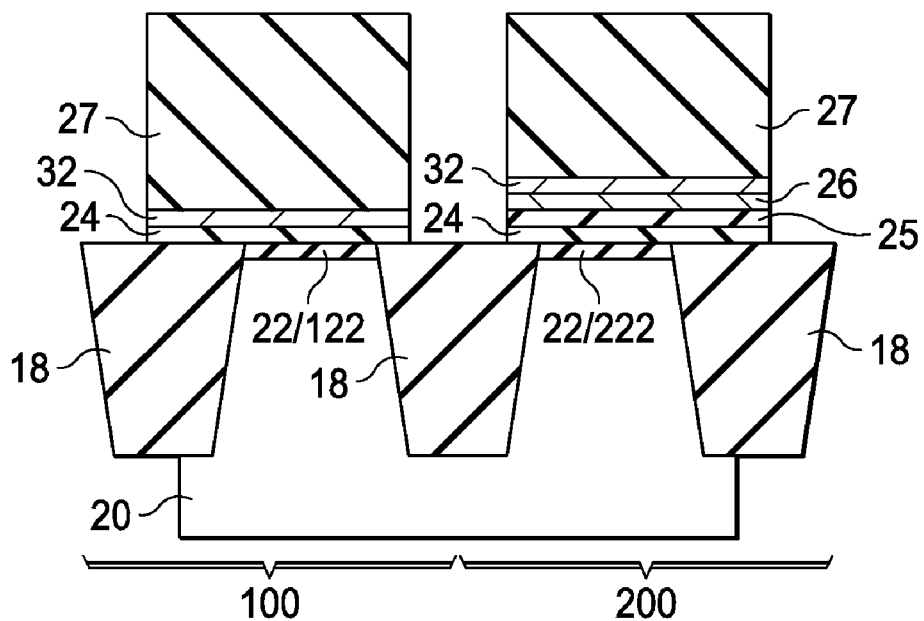

FIGS. 12 through 17 illustrate a third embodiment. The third embodiment is essentially the same as the first embodiment, except planar MOS devices, instead of FinFET devices, are formed. In the third embodiment and the subsequently discussed fourth embodiment, unless specified otherwise, like notations as used in the first and the second embodiments are used to denote like elements. Referring to FIG. 12, substrate 20 is provided, and STI regions 18 are formed to define NMOS device region 100 and PMOS device region 200. Next, as shown in FIG. 13, interfacial layer 22, including portions 122 and 222, first high-k dielectric layer 24, oxide cap 25, and first metal layer 26 are formed layer by layer. FIGS. 14 and 15 illustrate the formation of patterned photo resist 28, and the removal of first metal layer 26 and oxide cap 25 from NMOS device region 100. In FIG. 16, photo resist 28 is removed, followed by the formation of second metal layer 32 as shown in FIG. 17. Next, as shown in FIG. 18, silicon-containing layer 27 may be formed, followed by the patterning step to form gate stacks. Gate spacers (not shown) are then formed. Source/drain regions (not shown) are also formed in the active regions in substrate 20. The formation of planar MOS devices is thus finished.

Figure 19:
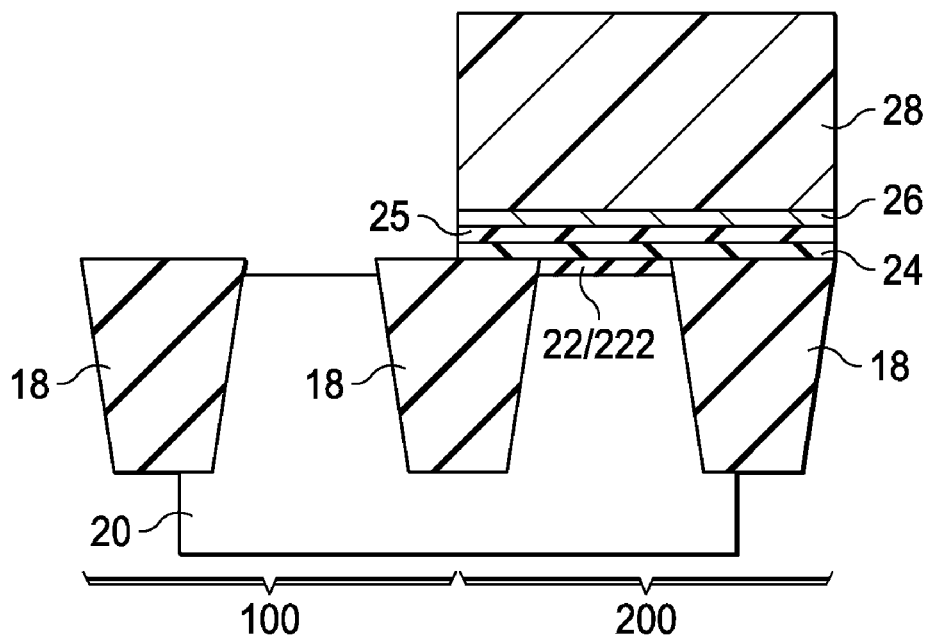
FIGS. 19 through 22 illustrate cross-sectional views of a fourth embodiment, wherein planar MOS devices are formed.
Figure 20:
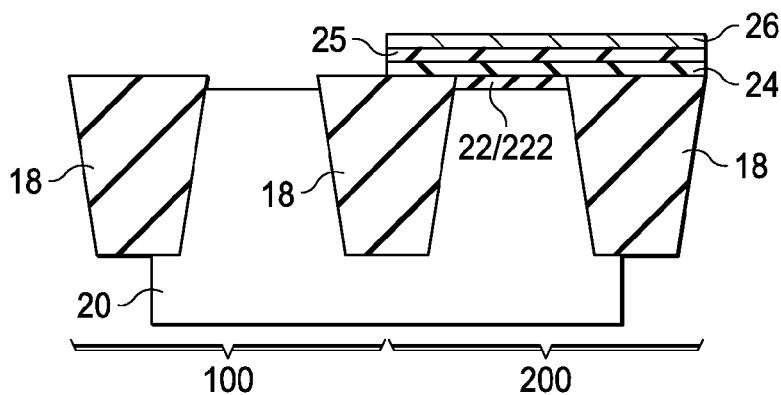

FIGS. 19 through 22 illustrate the fourth embodiment, which is similar to the third embodiment, except interfacial layer 22/122 and first high-k dielectric layer 24 are also removed from NMOS device region 100, and are re-grown. The initial steps are essentially the same as shown in FIGS. 12 through 14. Next, as shown in FIG. 19, the portions of interfacial layer 22/122, first high-k dielectric layer 24, and first metal layer 26 in NMOS device region 100 are all removed, until substrate 20 is exposed. FIG. 20 illustrates the removal of photo resist 28.

Figure 21:
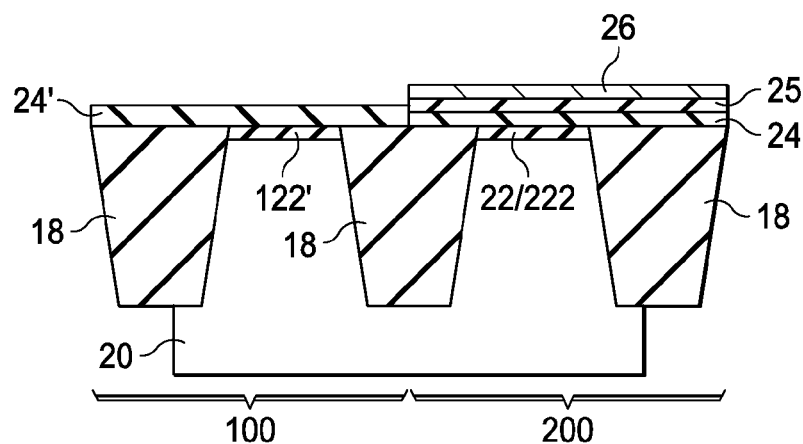
Figure 22:
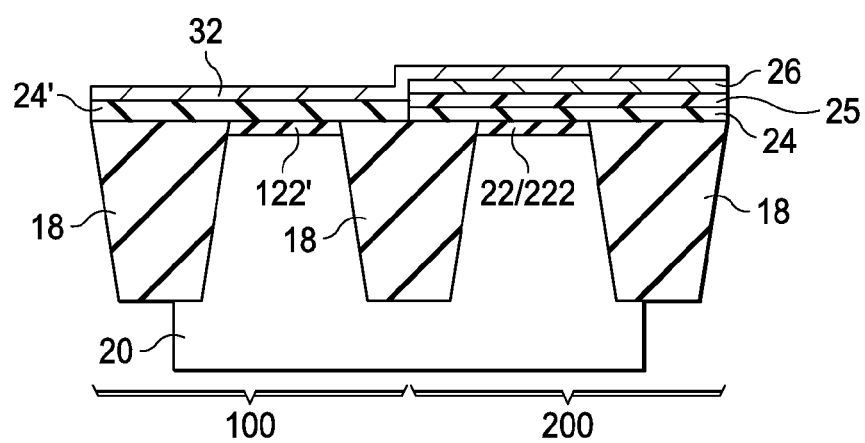

Referring to FIG. 21, interfacial layer 122' and second high-k dielectric layer 24' are selectively formed in NMOS device region 100, but not in PMOS device region 200. Next, as shown in FIG. 22, second metal layer 32 is formed, followed by subsequent process steps similar to those shown in FIG. 18, wherein silicon-containing layer 27 (not shown) may be formed, followed by a patterning step to form gate stacks. Gate spacers (not shown) are then formed. Source/drain regions (not shown) are also formed in the active regions in substrate 20.

In the embodiments discussed in preceding paragraphs, first device region 100 is referred to as NMOS device region 100, and device region 200 is referred to as PMOS device region 200. In alternative embodiments, first device region 100 may be a PMOS device region, while second device region 200 may be an NMOS device region. As a result, oxide cap 25 is left in the gate stack of the NMOS device, but not in the gate stack of the PMOS device. The process steps are essentially the same as the embodiments shown in FIGS. 1 through 22. However, first metal layers 26 and second metal layers 32 may adopt metals with work functions lower than the mid-gap work function, and may be about 4.5 eV, and even lower than 4.3 eV, or even close to about 4.1 eV. The metal element of the cap oxide has a lower electronegativity, e.g., La, than the metal element of the high-k dielectric, e.g., Hf. The process steps are essentially the same as shown in FIGS. 1 through 22. Those skilled in the art will recognize that the process steps may be adjusted for process optimization purpose.

The embodiments have several advantageous features. By forming first metal layer 26 before the step of removing oxide cap 25 from first device region 100, oxide cap 25 is protected from damage or loss in the step of removing photo resist 28 used to mask second device region 200. The accurate control of the thickness of oxide cap 25 is thus more achievable. Further, the steps for forming metal gates for NMOS devices and PMOS devices are decoupled, and the performance of the NMOS devices and the PMOS devices may be improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of forming an integrated circuit structure, the method comprising:
    providing a substrate comprising a first device region and a second device region;
    forming an oxide cap over the substrate and in the first device region and the second device region;
    forming a first metal layer over the oxide cap, wherein the first metal layer has a first portion in the first device region and a second portion in the second device region;
    forming a mask to cover the second portion of the first metal layer, wherein the first portion of the first metal layer is exposed;
    removing the first portion of the first metal layer and the oxide cap from the first device region;
    removing the mask; and
    forming a second metal layer in the first device region and the second device region, wherein the second metal layer in the second device region is over the second portion of the first metal layer.

2. The method of claim 1 further comprising:
    before the step of forming the oxide cap, forming an interfacial layer over the substrate, wherein the interfacial layer comprises a first portion in the first device region and a second portion in the second device region; and
    forming a high-k dielectric layer over the interfacial layer and underlying the oxide cap, wherein the high-k dielectric layer comprises a first portion in the first device region and a second portion in the second device region.

3. The method of claim 2 further comprising:
    before the step of removing the mask, removing the first portion of the interfacial layer and removing the first portion of the high-k dielectric layer; and
    after the step of removing the mask and before the step of forming the second metal layer, forming an additional interfacial layer in the first device region and forming an additional high-k dielectric layer in the first device region and over the additional interfacial layer.

4. The method of claim 2, wherein the oxide cap comprises a metal element having a first electronegativity higher than a second electronegativity of an additional metal element comprised by the high-k dielectric layer.

5. The method of claim 1, wherein the first device region is an NMOS device region and the second device region is a PMOS device region, and wherein the first metal layer and the second metal layer have work functions greater than a mid-gap work function.

6. The method of claim 1, wherein the first device region is a PMOS device region and the second device region is an NMOS device region, and wherein the first metal layer and the second metal layer have work functions lower than a mid-gap work function.

7. The method of claim 1 further comprising:
    forming a silicon-containing layer over the second metal layer; and
    patterning the first metal layer, the second metal layer, and the silicon-containing layer to form gate stacks.

8. A method of forming an integrated circuit structure, the method comprising:
    providing a substrate comprising a first device region and a second device region;
    forming an interfacial layer over the substrate;
    forming a high-k dielectric layer over the interfacial layer;
    forming an oxide cap over the high-k dielectric layer;
    forming a first metal layer over the oxide cap, wherein each of the interfacial layer, the high-k dielectric layer, the oxide cap, and the first metal layer comprises a first portion in the first device region and a second portion in the second device region;
    forming a mask to cover the second portion of the first metal layer, wherein the first portion of the first metal layer is uncovered by the mask;
    removing the first portions of the first metal layer and the oxide cap from the first region;
    removing the mask;
    forming a second metal layer in the first device region and the second device region, wherein the second metal layer is over the second portion of the first metal layer; and
    patterning the interfacial layer, the high-k dielectric layer, the oxide cap, the first metal layer, and the second metal layer to form a first gate stack in the first device region and a second gate stack in the second device region.

9. The method of claim 8 further comprising:
    before the step of removing the mask, removing the first portion of the interfacial layer and the first portion of the high-k dielectric layer; and
    after the step of removing the mask and before the step of forming the second metal layer, forming an additional interfacial layer in the first device region and forming an additional high-k dielectric layer over the additional interfacial layer in the first device region.

10. The method of claim 8, wherein the oxide cap comprises a metal element having a first electronegativity higher than a second electronegativity of an additional metal element comprised by the high-k dielectric layer.

11. The method of claim 8, wherein the first device region is an NMOS device region and the second device region is a PMOS device region, and wherein the first metal layer and the second metal layer have work functions greater than a mid-gap work function.

12. The method of claim 8, wherein the first device region is a PMOS device region and the second device region is an NMOS device region, and wherein the first metal layer and the second metal layer have work functions lower than a mid-gap work function.

13. The method of claim 8, wherein each of the first portion and the second portion of the interfacial layer comprises a planar portion and sidewall portions.

14. The method of claim 8, wherein an entirety of each of the first portion and the second portion of the interfacial layer is planar.

15. A method of forming an integrated circuit structure, the method comprising:
- providing a substrate comprising a first fin in a first device region and a second fin in a second device region;
- forming an oxide cap over a top surface and sidewalls of each of the first fin and the second fin;
- forming a first metal layer over the oxide cap and in the first device region and the second device region;
- forming a mask, wherein a first portion of the first metal layer in the first device region is exposed and a second portion of the first metal layer in the second device region is covered by the mask;
- removing the first portion of the first metal layer and the oxide cap from the first device region; and
- removing the mask.

16. The method of claim 15 further comprising:
- after the step of removing the mask, forming a second metal layer in the first device region and the second device region, wherein the second metal layer comprises a portion over the second portion of the first metal layer;
- forming a silicon-containing layer over the second metal layer;
- patterning the first metal layer and the silicon-containing layer to form a first gate stack in the first device region; and
- patterning the oxide cap, the first metal layer, the second metal layer, and the silicon-containing layer to form a second gate stack in the second device region.

17. The method of claim 16, wherein the first device region is an NMOS device region and the second device region is a PMOS device region, and wherein the first metal layer and the second metal layer have work functions greater than a mid-gap work function.

18. The method of claim 16, wherein the first device region is a PMOS device region and the second device region is an NMOS device region, and wherein the first metal layer and the second metal layer have work functions lower than a mid-gap work function.

* * * * *